United States Patent [19]
Nakamura et al.

[11] Patent Number: 5,472,564
[45] Date of Patent: Dec. 5, 1995

[54] METHOD OF DRY ETCHING WITH HYDROGEN BROMIDE OR BROMIDE

[75] Inventors: Moritaka Nakamura, Yokohama; Takashi Kurimoto, Hashima; Katsuhiko Iizuka, Kawasaki, all of Japan

[73] Assignee: Fujitsu Limited, Kawasaki, Japan

[21] Appl. No.: 104,546

[22] Filed: Aug. 11, 1993

Related U.S. Application Data

[62] Division of Ser. No. 68,615, May 27, 1993, Pat. No. 5,316,616, which is a continuation of Ser. No. 670,516, Mar. 18, 1991, abandoned, which is a continuation of Ser. No. 307,710, Feb. 8, 1989, abandoned.

[30] Foreign Application Priority Data

Feb. 9, 1988 [JP] Japan ................. 63-026654
Jul. 19, 1988 [JP] Japan ................. 63-178244
Sep. 28, 1988 [JP] Japan ................. 63-240940
Nov. 15, 1988 [JP] Japan ................. 63-286880

[51] Int. Cl.⁶ .................................. H01L 21/306
[52] U.S. Cl. .................. 216/51; 437/225; 216/67; 216/79

[58] Field of Search .................. 156/643, 662; 437/225

[56] References Cited

U.S. PATENT DOCUMENTS

| | | | |
|---|---|---|---|
| 4,490,209 | 12/1984 | Hartman | 156/643 |
| 4,744,861 | 5/1988 | Matsunaga | 156/643 |
| 4,799,991 | 1/1989 | Dockrey | 156/643 |
| 4,943,344 | 7/1990 | Tachi et al. | 156/643 |
| 5,007,982 | 4/1991 | Tsou | 156/643 |

FOREIGN PATENT DOCUMENTS 0272143 6/1988 European Pat. Off. .

Primary Examiner—Brian E. Hearn
Assistant Examiner—Lynne A. Gurley
Attorney, Agent, or Firm—Armstrong, Westerman, Hattori, McLeland & Naughton

[57] ABSTRACT

Plasma etching with hydrogen bromide or bromine as an etching gas allows a precise control in attaining vertical etching or taper etching with a desired taper angle by controlling the temperature of a mass to be etched, which mass is usually a semiconductor wafer.

5 Claims, 7 Drawing Sheets ized circuits (IC), an insulating film such as a gate insulating film must be made thinner, for example, 30 nm to 50 nm, and further, a multilayer technology for electrical conductive materials such as polycrystalline silicon must be utilized. This processing of such a polycrystalline silicon determines a gate length, which influences the characteristics of a field effect transistor (FET), and thus during etching of the polycrystalline silicon, the width of a pattern must be strictly controlled and a high etching selectivity of the polycrystalline silicon obtained in relation to an underlying gate insulating layer. To accomplish the above, vertical etching methods, such as reactive ion etching, can be used, but if a lower layer, for example, a first polycrystalline silicon layer, is vertically etched, the thickness of an upper layer, for example, a second polycrystalline silicon layer, becomes thicker at a portion of a step of the vertically etched first polycrystalline silicon layer than at the other flat portion. This thicker portion of the second polycrystalline silicon layer remains after the second polycrystalline silicon layer is etched, and leads to a short circuiting of adjacent patterns of the second polycrystalline silicon layer through the remaining portion. If the second polycrystalline silicon layer is over-etched for an extended time, to completely remove the polycrystalline silicon at the step portion, the width of a pattern is narrowed and the underlying insulating layer is excessively etched.

METHOD OF DRY ETCHING WITH HYDROGEN BROMIDE OR BROMIDE

This is a division of application Ser. No. 08/068,615 filed May 27, 1993 now U.S. Pat. No. 5,316,616, which is a continuation of application Ser. No. 07/670,516, filed on Mar. 18, 1991, now abandoned, which is a continuation of Ser. No. 07/307,710, filed Feb. 8, 1989, now abandoned.

BACKGROUND OF THE INVENTION

1. Field of the Invention

The present invention relates to dry etching a material such as polycrystalline silicon and silicides with hydrogen bromide or bromine.

2. Description of the Related Art

As a result of the increased degree of integration and switching speed of integrated circuits (IC), an insulating film such as a gate insulating film must be made thinner, for example, 30 nm to 50 nm, and further, a multilayer technology for electrical conductive materials such as polycrystalline silicon must be utilized. This processing of such a polycrystalline silicon determines a gate length, which influences the characteristics of a field effect transistor (FET), and thus during etching of the polycrystalline silicon, the width of a pattern must be strictly controlled and a high etching selectivity of the polycrystalline silicon obtained in relation to an underlying gate insulating layer. To accomplish the above, vertical etching methods, such as reactive ion etching, can be used, but if a lower layer, for example, a first polycrystalline silicon layer, is vertically etched, the thickness of an upper layer, for example, a second polycrystalline silicon layer, becomes thicker at a portion of a step of the vertically etched first polycrystalline silicon layer than at the other flat portion. This thicker portion of the second polycrystalline silicon layer remains after the second polycrystalline silicon layer is etched, and leads to a short circuiting of adjacent patterns of the second polycrystalline silicon layer through the remaining portion. If the second polycrystalline silicon layer is over-etched for an extended time, to completely remove the polycrystalline silicon at the step portion, the width of a pattern is narrowed and the underlying insulating layer is excessively etched.

One solution to the above problems is the use of a vertical etching process having a high selectivity, so that an underlying layer is not excessively etched. To obtain this high selectivity, a chlorine-bearing or fluorine-bearing etching gas is widely used, but etching with a chlorine or fluorine-bearing gas tends to cause side-etching, due to the isotropic nature thereof, and it becomes difficult to control the width of a pattern. To protect the side wall of a pattern from such an etching gas, a carbon-bearing gas may be used, but use of a carbon-bearing gas increases the etching rate of an insulating layer, whereby the selectivity of etching of a polycrystalline silicon, etc. in relation to an insulating layer is reduced. Further, a polymer containing carbon is deposited onto a wall of an etching chamber, which causes contamination in the form of particles and a reduction of the product yield.

Another solution is to form a pattern of a first polycrystalline silicon layer having a tapered shape, i.e., a declined, not vertical, side wall, on which a second polycrystalline silicon layer is deposited and then etched.

The known methods of taper etching are as follows:

(1) Phosphorus is diffused and phosphorus ions are then implanted to a first polycrystalline silicon layer, to make the ion implanted surface portion of the layer more receptive to etching. Then isotropic etching is carried out on the polycrystalline silicon layer, and thus the polycrystalline silicon layer is taper etched. [Japanese Unexamined Patent Publication Nos. 58-4932 and 53-73086 and Japanese Examined Patent Publication No. 60-782] Nevertheless, this process is complicated, since a diffusion of phosphorus and ion implantation is necessary before the etching. Also, it is difficult to control a width of a pattern during isotropic etching.

(2) Etching with an etching gas to which a depositing gas such as $C_2H_6$, $C_2H_4$, is added to provide a simultaneous etching and deposition to form a tapered pattern. [Japanese Unexamined Patent Publication Nos. 59-103338, 62-30330 and 62-32618]. This method allows a deposition on a wall of an etching chamber, which results in contamination by particles and reduces the product yield.

(3) A resist mask is tapered and etching is effected with a low etching selectivity between polycrystalline silicon and the resist. [Japanese Unexamined Patent Publication (Kokai) No. 61-61424]. In this method, since the thickness of the resist is varied, it is difficult to control the width of a pattern.

(4) Alternate etching and ashing of a resist mask. [Japanese Unexamined Patent Publication (Kokai) No. 56-93319 and 57-59331]. This process is complicated and control of the width of a pattern is difficult, since the thickness of the resist mask is reduced.

(5) Isotropic etching followed by anisotropic etching. The isotropic etching is stopped when only an upper part of a polycrystalline silicon layer is etched, and then the anisotropic etching is carried out. [Japanese Unexamined Patent Publication No. 57-7936 and 56-90525]. This process also is complicated, and the control of the width of a pattern is difficult.

(6) A mask having an overhanging portion having a lower surface facing upward is used, so that the flow of ions is disturbed and thus a tapered pattern is formed. [Japanese Examined Patent Publication No. 57-42154]. It is not easy, however, to form a resist mask having an overhanging portion as above, and it is difficult to control the width of an etched pattern.

Therefore, the main object of the present invention is to provide a process for anisotropic etching of a material such as polycrystalline silicon and silicides, which process is simple and easily controlled. Another object of the present invention is to provide a process for taper etching such a material, which process is simple and able to control the taper angle of an etched pattern. A further object of the present invention is to provide a process for vertically etching such a material with a high etching selectivity, without side-etching.

SUMMARY OF THE INVENTION

The above and other objects, features and advantages are attained by a process for selectively etching a mass, comprising: providing an etching mask over the mass to expose an area of the mass to be etched; and providing a plasma of an etching gas in contact with the mass, the etching gas containing hydrogen bromide, bromine or a combination thereof as a main reactive component that reacts with the mass, whereby the exposed area of the mass is selectively etched to form a mass having an etched portion and a side wall along a periphery of the etching mask; wherein an angle of inclination of the side wall is controlled by selecting a temperature of the mass during the etching.

Japanese Examined Patent Publication No. 58-14507, corresponding to U.S. patent application Ser. No. 594418, filed on Jul. 9, 1975, now abandoned, suggests that a bromine or a bromine compound may be used for a vertical etching of silicon, but in this publication, only carbon tetrachloride is actually used in experiments, and bromine or a bromine compound is mentioned merely as a possible alternative. Furthermore, this publication states that a target electrode must be heated, since the boiling point of SiBr, at which it is thought to be vaporized, is 153° C. The present inventors, however, surprisingly found that a vertical etching of silicon, etc., can be carried out at a temperature lower than 150° C. and further, that a taper etching can be obtained at a temperature of −40° C. to 50° C. in which process the taper angle of the etching is precisely controlled in accordance with the temperature.

U.S. Pat. No. 4,490,209 issued on Dec. 25, 1984 to Hartman discloses a plasma etching which allows an anisotropic etching of silicon, in which a gaseous mixture of a chlorine-bearing species and hydrogen bromide is used. In this patent, however, a chlorine-bearing species must be used as a main reactive component and hydrogen bromide added in a small amount of about 1 to about 10%, to allow a near perfect anisotropic etching. This process is different from the process of the present invention, in which hydrogen bromide or bromine is used as a main etching or reactive component and not only a vertical etching but also a taper etching can be carried out, and the taper angle controlled as desired.

Therefore, in accordance with the present invention, a taper etching having an inclination angle of the side wall of an etched mass of less than 90° is obtained at a temperature of the mass etched of −40° C. to +50° C., and a Substantially vertical etching is carried out at a temperature of the etched mass of 50° C. to 150° C. The relationship between the angle of inclination of the side wall of the mass etched and the temperature of the mass etched is expressed as follows:

$$\theta \div t/2 + 65$$

where $\theta$ stands for the inclination angle of the side wall of the etched mass and t stands for the temperature of the mass during etching, the inclination angle $\theta$ having a dispersion of ±5°. Note, the temperature mentioned above is that of the mass to be etched, not that of an atmosphere surrounding the mass to be etched. Furthermore, for a p-type or non-doped polycrystalline silicon, at a temperature of an etched mass of more than 150° C., a taper etching having an inclination angle of the side wall of the etched mass of more than 90° can be obtained. For an n-type polycrystalline silicon, at a temperature of more than 150° C., side etching or undercut profile is obtained.

As described above, a carbon-bearing etching gas may cause deposition of a polymer onto a wall of an etching chamber, which may result in contamination by particles in products. Further, a carbon-bearing etching gas may reduce the etching selectivity of a material such as polycrystalline silicon or silicides. Accordingly, the etching gas used in a process of the present invention preferably does not contain a carbon-bearing component. Similarly, the etching chamber preferably does not include a carbon-bearing material which can come into contact with a plasma of an etching gas. Such a carbon-bearing material disadvantageously reduces the etching selectivity of a material to be etched. And the content of carbon in the etching gas is preferably less than 120 ppm, more preferably less than 40 ppm, based on the total weight of the etching gas.

In accordance with the present invention, there is also provided a process for selectively etching a mass, comprising: providing an etching mask of an organic material over the mass to expose an area of the mass to be etched; providing a plasma of an etching gas in contact with the mass, the etching gas containing hydrogen bromide as a main reactive component that reacts with the mass, whereby the exposed area of the mass is selectively etched; and providing, around the mass having the etching mask of the organic material thereover, an atmosphere containing excited oxygen atoms separated from a plasma thereof.

When plasma etching is carried out using hydrogen bromide as an etching gas and an organic resist as a mask, followed by ashing the organic resist mask, a thin film remains in the form of a fence along the periphery of an original pattern of the organic resist mask. This thin film may result in contamination by particles and reduce the product yield. This thin film in the form of a fence can be removed by cleaning with a dilute fluoric acid, but this may damage an underlying layer, for example, a gate oxide film, and thus cannot be used in the fabrication of semiconductor devices. Silicon oxide and nitride layers may be used as a mask, without raising the above problem, instead of an organic mask, but the use of these layers complicates the process.

As a result of attempts to solve this problem, the inventors found that the thin film in the form of a fence is formed from carbon, bromine, oxygen, hydrogen and, if present, silicon, etc., during plasma etching with hydrogen bromide, and that this thin film cannot be removed by oxygen plasma ashing but can be removed by treatment with an excited oxygen-atom-containing atmosphere separated from a generated plasma. Here, an excited oxygen-atom-containing atmosphere is formed by transportation of excited oxygen atoms, mainly in the state of neutral atoms, from a plasma, mainly in the state of ions, generated by an electrical discharge or microwave irradiation, the transportation of excited oxygen atoms being caused by a pressure difference. Therefore, an excited oxygen-atom-containing atmosphere can be formed downstream of an oxygen plasma.

The organic resist used for plasma etching with hydrogen bromide can be removed by oxygen plasma ashing, except for a portion of the fence-like thin film. Therefore, treatment of the organic mask in an excited oxygen-atom-containing atmosphere can be combined with a normal oxygen plasma ashing before or after the former treatment.

The excited oxygen atom-containing atmosphere may be formed from mainly oxygen gas ($O_2$), to which a halogen-bearing gas such as $CF_4$, nitrogen or water may be added to increase the generation of oxygen atom.

The general conditions for ashing with an excited oxygen-atom-containing atmosphere are shown as follows:

| | |
|---|---|
| Temperature of mass to be ashed | 0–170° C. |
| Gas pressure | 0.1–10 Torr |
| Oxygen gas concentration | 0.1–5 s/m |
| Gases added to oxygen gas | |
| $CF_4$ | 0.1–25% |
| $N_2$ | 3–100% |
| $H_2O$ | 100–300% |
| Plasma generating microwave power | 100–3000 W |
| Treatment time | 5–600 sec |

DESCRIPTION OF THE PREFERRED EMBODIMENTS

Figure 1A:
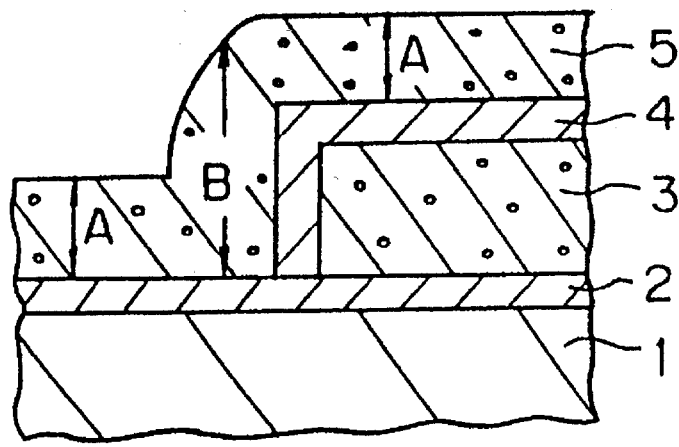
FIGS. 1A to 1C show the main steps of dry etching an upper layer of polycrystalline silicon on a lower layer of polycrystalline silicon.
Figure 1B:
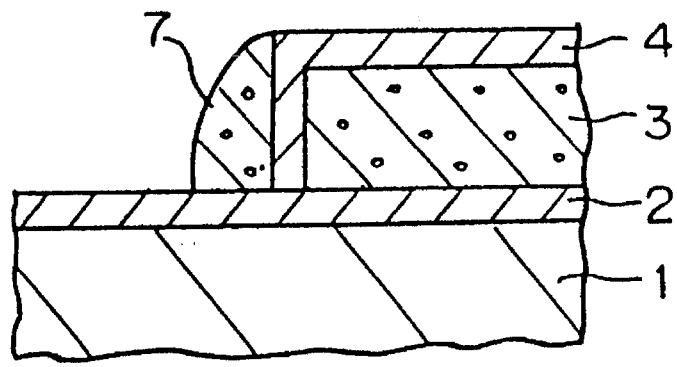
Figure 1C:
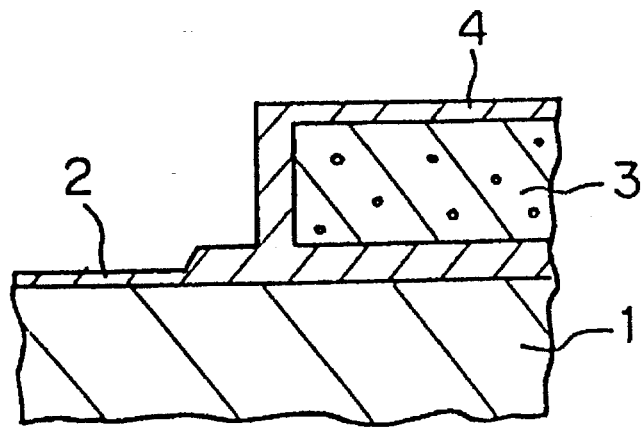
Figure 2:
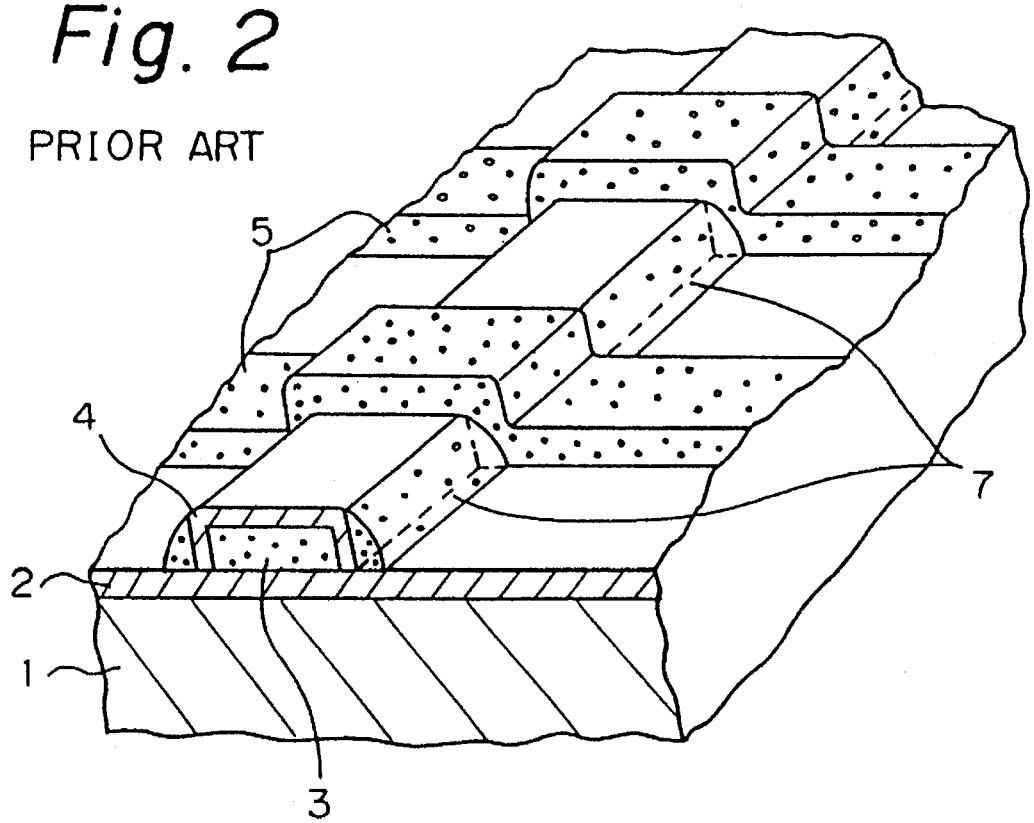
FIG. 2 is a perspective view showing an etching residue resulting from dry etching as shown in FIGS. 1A to 1C.

Before describing the present invention in detail, the prior art is briefly illustrated using drawings. FIGS. 1A to 1C illustrate the steps of reaction ion-itching (RIE) of an upper polycrystalline silicon layer on a step portion of a lower polycrystalline silicon layer. In FIG. 1A, 1 denotes a silicon substrate, 2 an insulating film, 3 a first polycrystalline silicon layer, 4 an insulating film, and 5 a second polycrystalline silicon layer deposited by CVD. The second layer 5 has different thickness A and B over flat and step portions of the first layer 3; wherein the thickness B of the second layer over the step portion is larger than the thickness A over the flat portion. When this structure is subject to RIE, a portion 7 of the second polycrystalline silicon layer near the step portion of the first polycrystalline silicon layer 3 remains unetched, as seen in FIG. 1B. This remaining portion 7 may cause a short circuit between adjacent wiring patterns of the second polycrystalline silicon layer, as seen in FIG. 2. If the second polycrystalline silicon layer 5 is subject to overetching, to completely remove the portion 7, the insulating films 2 and 4 are undesirably excessively etched as seen in FIG. 1C. This is because of a relatively low selectivity of etching between the polycrystalline silicon and the insulating films.

The present invention is now described in more detail.

Figure 3:
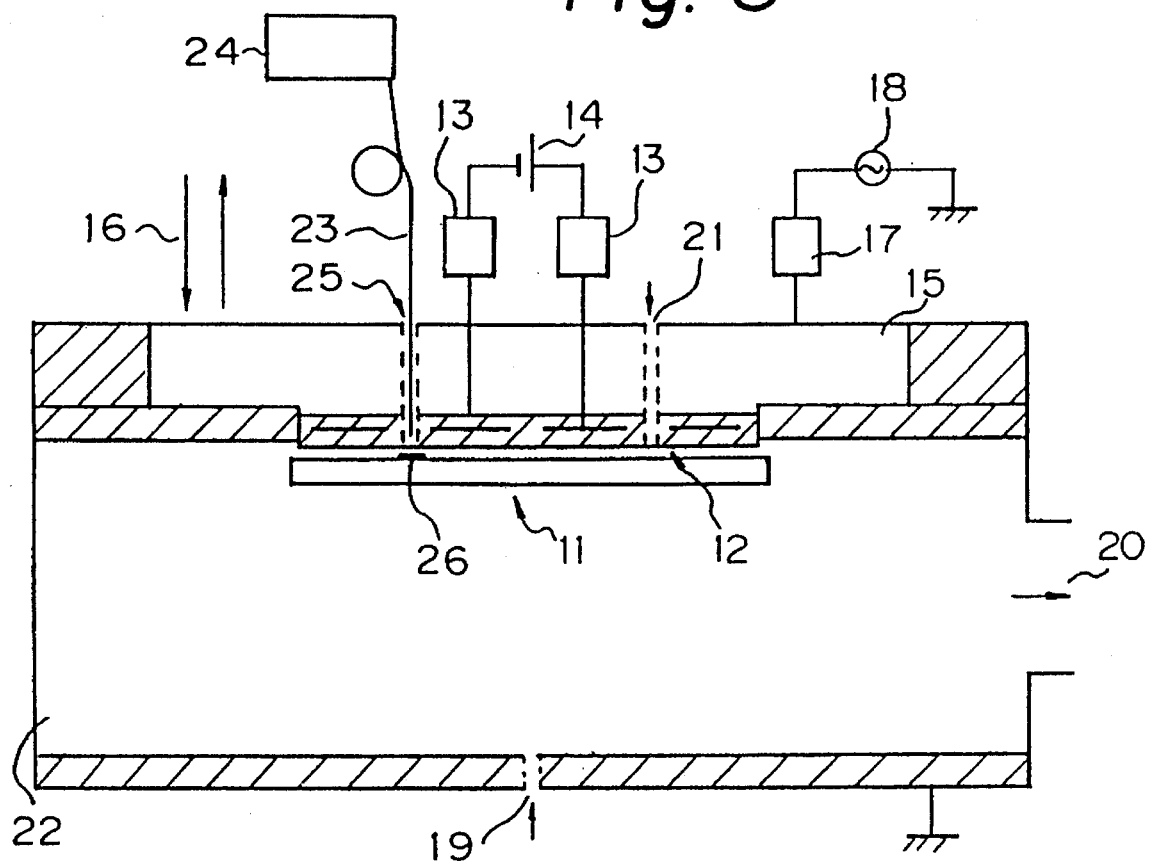
FIG. 3 is a schematical view of an apparatus for plasma etching used in a process according to the present invention.

FIG. 3 shows a reactive ion etching (RIE) apparatus used in the following example. In this apparatus, a wafer 11 is electrostatically mounted to an electrostatic chuck 12 by applying a voltage of ±1500 V to the chuck 12 through low pass filters 13, from a DC power source 14. A gas, for example, helium under a pressure of 0–20 Torr, is introduced between the wafer and the chuck 12, through a gas inlet 21 from a pressure-adjusting unit (not shown), to facilitate thermal conduction. The temperature of the electrode 15 is controlled by cooling water 16. When the electrode 15 is to be cooled to less than 0° C., the cooling liquid is composed of methanol, a mixture of water and ethylene glycol, or a mixture of water and methanol. An etching chamber 22 is evacuated through an exhaust port 20 by a vacuum pump (not shown). An etching gas is introduced to the chamber 22 through a gas introducing port 19, and a high frequency wave is applied to the gas by an RF generator 18 through a matching box 17, to generate a plasma and thereby carry out an etching.

The temperature of the wafer 11 during etching is detected by a fluorescent thermometer 24. A fluorescent material 26 is applied on a rear side surface of the wafer 11, and a pulse light is irradiated to the fluorescent material 26 through a glass fiber 23 passing through a pore 25 of the electrode 15, and a fluorescent light generated from the fluorescent material 26 is observed through the same glass fiber 23 to determine the temperature of the wafer 11. The fluorescent thermometer 24 used is the LUXTRON 750 marketed by LUXTRON (1060 Terra Bella Avenve, Mountain View, Calif. 94043, U.S.A.). This thermometer can advantageously precisely determine the wafer temperature without interference by noise from the RF, since it uses a glass fiber; unlike a conventional thermocouple which cannot block the noise from the RF. This precise determination of the water temperature is essential to the present invention.

The temperature of a wafer depends on the etching gas, pressure, RF power, etc., but can be controlled, even when these conditions are fixed, by changing the temperature of the cooling liquid 16 to change the temperature of the electrode 15, by changing the kind or pressure of the gas such as He introduced between the wafer 11 and the electrostatic chuck 12, or by changing the voltage applied to the chuck 12 to change the force attracting the wafer 11, to change the thermal conduction between the wafer 11 and the electrode 15.

Figure 4A:
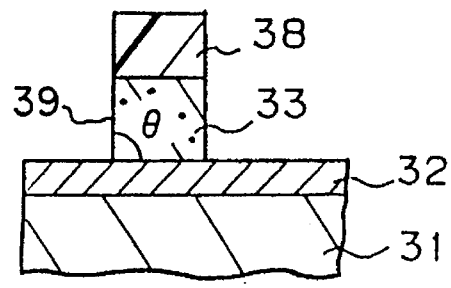
FIGS. 4A to 4E are sectional views of patterns etched in accordance with a process of the present invention.
Figure 4B:
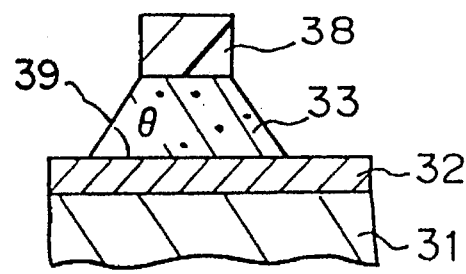
Figure 4C:
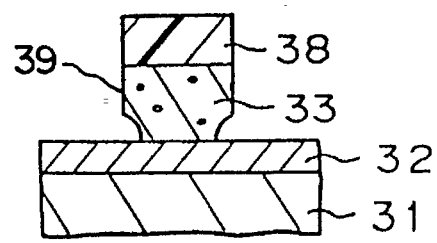
Figure 4D:
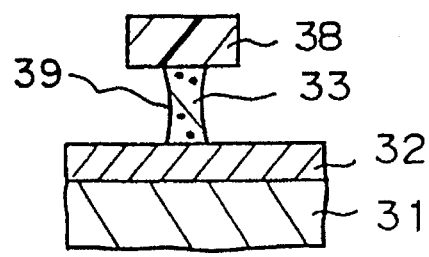

FIGS. 4A to 4D show cross sections of a phosphorus-doped n-type polycrystalline silicon (resistance 60 $\Omega/cm^2$) pattern etched in accordance with the present invention and using an apparatus shown in FIG. 3. In FIGS. 4A and 4B, reference numeral 38 denotes a mask of a photoresist, $SiO_2$, $Si_3N_4$, etc., 33 denotes a polycrystalline silicon layer to be etched, 32 denotes an underlying insulating film of $SiO_2$, etc., and 31 denotes.a silicon substrate. The etching conditions are as follows: a gas of $Br_2$ (16 SCCM)+Hc (57 SCCM), a pressure of 0.1 Torr, a power of 300 W, and 100% overetching after etching the polycrystalline silicon layer 33. FIG. 4A shows a pattern etched at 80° C.; FIG. 4B a pattern etched at 0° C.; and FIG. 4C a pattern etched at 160° C.; and FIG. 4D a pattern etched at 200° C. In these figures the angle of inclination of a side wall 39 of the etched pattern 33 is designated by the mark θ. The angle θ is about 90° in FIG. 4A, about 60° in FIG. 4B. As seen in these figures, varied etching shapes are obtainable by changing only the temperature of a wafer.

Figure 4E:
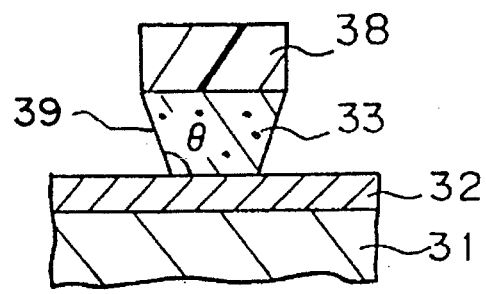
Figure 5:
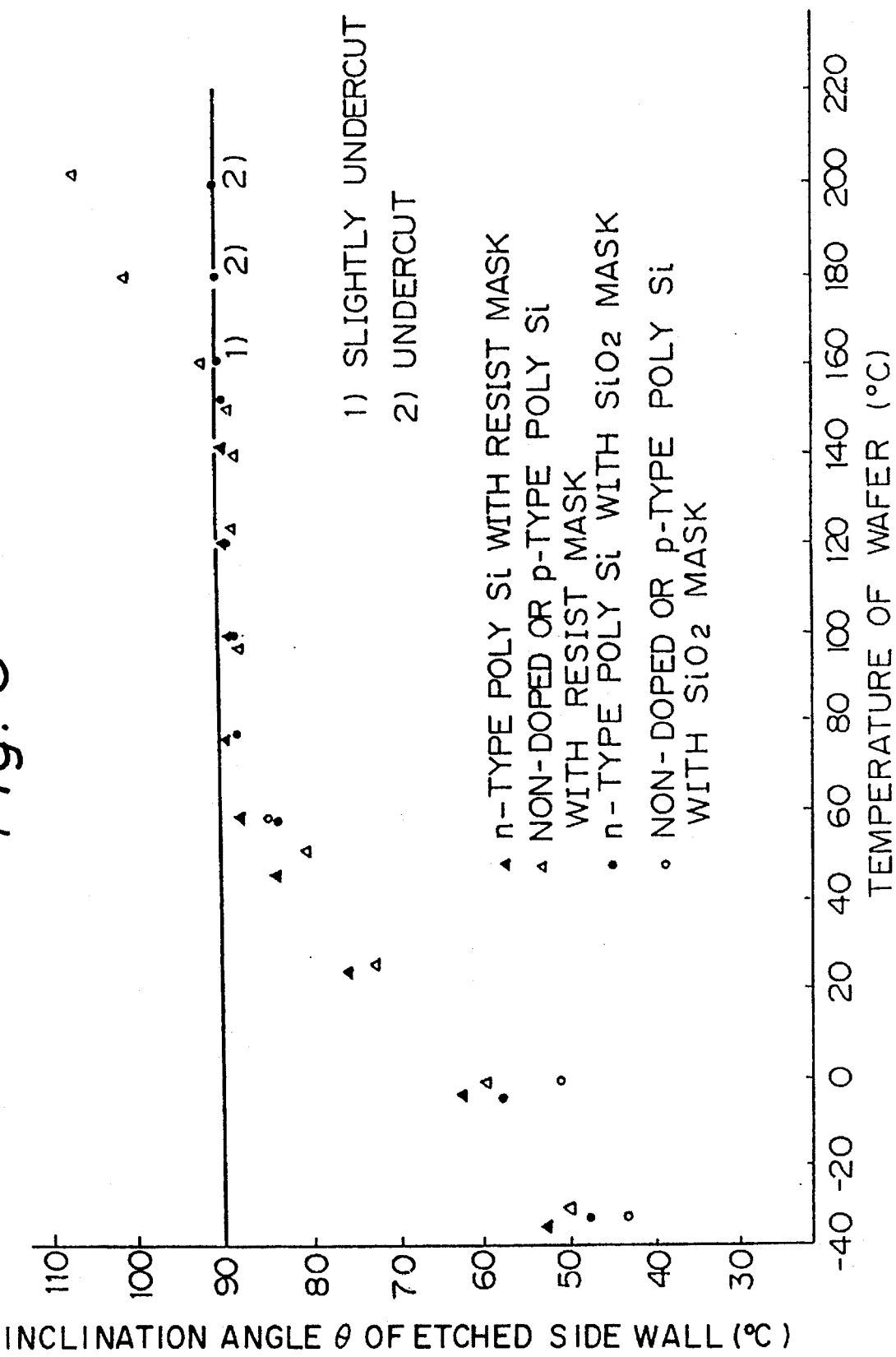
FIG. 5 shows relationships of the taper angle obtainable by the dry etching and the temperature of a wafer during etching.

FIG. 5 shows the relationship between the inclination angle θ of an etched polycrystalline silicon and a temperature of the wafer, in which n-type doped and non-doped polycrystalline silicons are etched with a mask of a photoresist or $SiO_2$. In FIG. 5, the black triangles represent an n-type doped polycrystalline silicon etched with a photoresist mask; the black circles represent an n-type doped polycrystalline silicon etched with an $SiO_2$ mask; the white triangles represent a non-doped polycrystalline silicon etched with a photoresist mask; and, the white circles represent a non-doped polycrystalline silicon etched with an $SiO_2$ mask. As seen in FIG. 5, an angle of inclination of an etched pattern of less than 90° is obtained at a wafer temperature of −40° to +50° and the inclination angle is increased with an increase of the wafer temperature in the above temperature range. This relationship is represented by the formula: θ=t/2+ 65±5, i.e., t/2+60≦θ≦t/2+70, wherein t stands for the wafer temperature. At a wafer temperature of 50° C. to 150° C., the polycrystalline silicons are etched substantially vertically, i.e., the inclination angle θ is about 90°. At a wafer temperature of more than 150° C. for a non-doped polycrystalline silicon, the inclination angle θ of the etched polycrystalline silicons may be more than 90° as shown in FIG. 4E. Note that, at a wafer temperature of more than about 150° C., the photoresist may be burnt and special heat treatment such as deep UV cure is required. Accordingly, a desired inclination angle θ of an etched polycrystalline silicon pattern can be obtained by changing the wafer temperature. At a wafer temperature of less than –40° C., an appropriate etching cannot be carried and needle-like residues remain.

EXAMPLE 1

An $SiO_2$ layer having a thickness of 20 nm, on which a phosphorus-doped polycrystalline silicon layer (resistance 20 $\Omega/cm^2$) was deposited to a thickness of 400 nm, was thermally grown On the surface of a silicon substrate. A photoresist pattern was formed on the phosphorus-doped polycrystalline silicon layer by a usual photolithography technique. The substrate or wafer was mounted in the apparatus as shown in FIG. 3, and an RIE was carried out under a supply of an etching gas of 16 SCCM—$Br_2$+57 SCCM—He, a pressure of 0.1 Torr, a power of 300 W, He supplied between the wafer and the electrostatical chuck at 10 Torr, a cooling liquid temperature of –15° C., and an electrode temperature of –10° C. The maximum wafer temperature was 0° C.

The results are shown in the following Table 1. The width of the etched polycrystalline silicon pattern was the same as that of the mask.

EXAMPLE 2

The procedures of Example 1 were repeated except that the cooling liquid temperature was 25° C., the electrode temperature was 25° C., and the He pressure was 2 Torr. The maximum wafer temperature was 50° C.

The results are shown in Table 1.

EXAMPLE 3

After a phosphorus-doped polycrystalline silicon layer was deposited, and a CVD $SiO_2$ layer having a thickness of 100 nm was grown thereon and patterned by a usual photolithography technique using RIE with photoresist. After removing the photoresist, the procedures of Example 1 were repeated.

The results are shown in Table 1.

EXAMPLE 4

A sample prepared in accordance with the procedures of Example 3 was etched under the same conditions as in Example 2, followed by an overetching of the polycrystalline silicon for the same time as required for the former etching.

The results are shown in Table 1.

EXAMPLE 5

The same sample as in Example 1 was etched under a supply of an etching gas of 25 SCCM—HBr+57 SCCM—He, a pressure of 0.12 Torr, a power of 350 W, He supplied between the wafer and the chuck at 10 Torr, a cooling liquid temperature of –15° C., and an electrode temperature of –10° C. The maximum wafer temperature was 5° C. The results are shown in Table 1.

EXAMPLE 6

As in Example 5, etching was carried out under a cooling liquid temperature of 20° C., an electrode temperature of 20° C., and an He pressure of 2 Torr. The maximum wafer temperature was 50° C. Overetching was carried out for the same time as required for the former etching.

The results are shown in Table 1.

TABLE 1

| Ex. | Mask | Wafer temp. (°C.) | Etching[1] rate (nm/min) | Etching[2] selectivity | Etching inclination angle θ |
|---|---|---|---|---|---|
| 1 | Resist | 0 | 150 | 10 | 57° |
| 2 | Resist | 50 | 200 | 23 | 82°* |
| 3 | $SiO_2$ | 0 | 150 | 30 | 62° |
| 4 | $SiO_2$ | 50 | 200 | 50 | 89°* |
| 5 | Resist | 5 | 100 | 15 | 62° |
| 6 | Resist | 50 | 170 | 27 | 92° |

[1] Etching rate is that of the polycrystalline silicon
[2] Etching selectivity is that of polycrystalline silicon to $SiO_2$.
*The angles 82°, 89°and 92° are considered substantially vertical.

EXAMPLES 7–14

A sample prepared as in Example 3 was etched under a supply of an etching gas of 50 SCCM—HBr, a power of 0.1 Torr, a power of 300 W (a power density of 0.66 W/cm$^2$), and He supplied between the wafer and the chuck at 10 Torr. The electrode temperature was controlled by heating with a heater arranged in the electrode, to within 80° C. to 300° C.

The results are shown in Table 2.

TABLE 2

| Ex. | Mask | Wafer temp. (°C.) | Etching rate (nm/min) | Etching selectivity | Etching inclination angle θ |
|---|---|---|---|---|---|
| 7 | $SiO_2$ | 80° C. | 300 | 30 | vertical (90°) |
| 8 | $SiO_2$ | 100° C. | 310 | 31 | vertical (90°) |
| 9 | $SiO_2$ | 130° C. | 320 | 32 | vertical (90°) |
| 10 | $SiO_2$ | 150° C. | 330 | 33 | vertical (90°) |
| 11 | $SiO_2$ | 160° C. | 320 | 32 | slightly undercut (as in FIG. 4C) |
| 12 | $SiO_2$ | 180° C. | 310 | 26 | undercut (as in FIG. 4D) |
| 13 | $SiO_2$ | 200° C. | 300 | 21 | undercut (as in FIG. 4D) |
| 14 | $SiO_2$ | 300° C. | 240 | 13 | undercut (as in FIG. 4D) |

EXAMPLE 15

Figure 6:
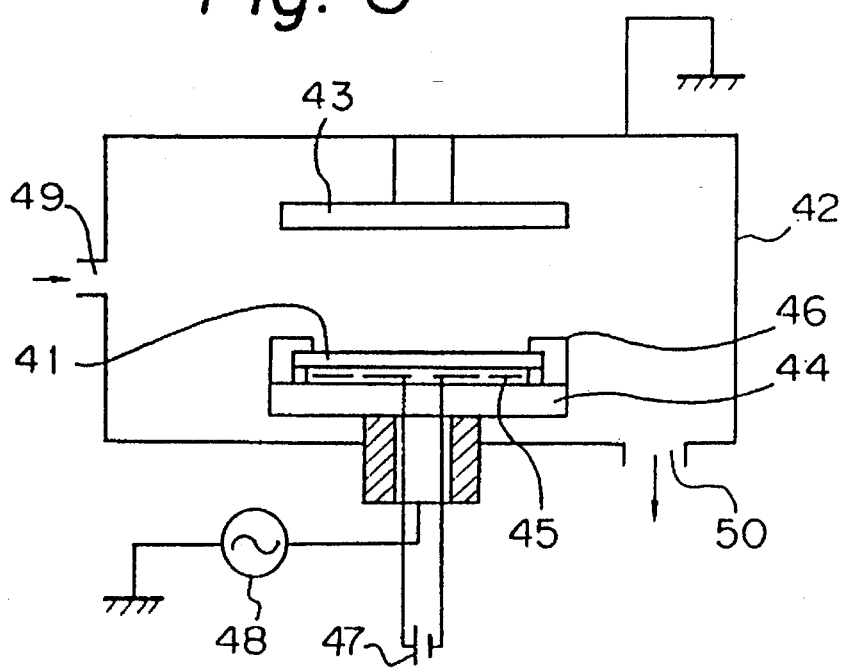
FIG. 6 is a schematical view of an apparatus for plasma etching used in an Example of the present invention.

FIG. 6 shows a parallel plan-type apparatus for RIE used in these Examples, in which 41 denotes a wafer, 42 an etching chamber, 43 an upper electrode, 44 a lower electrode, 45 an electrostatic chuck, 46 a block of quartz glass for holding a wafer, 47 a DC power source for electrostatical attraction of a wafer, 48 a high frequency power, 49 a gas inlet, and 50 a gas outlet. The wafer temperature was determined by a fluorescent thermometer, not shown. The walls of the etching chamber 42 and the surface of the upper electrode 42 are covered with quartz glass or a material that does not contain carbon.

A sample for etching was prepared as follows: On a silicon substrate or wafer, an $SiO_2$ film having a thickness of 100 nm was thermally grown, on which a polycrystalline silicone layer having a thickness of about 400 nm was deposited, on which, in turn, a mask pattern of $SiO_2$ or $Si_3N_4$ having a thickness of about 200 nm and a width of 1 μm.

The above sample was held by the holder 46 or by the electrostatic chuck 45, and the sample was subject to RIE to selectively etch the polycrystalline silicon. The etching gas was HBr and was introduced at 50 SCCM from the gas inlet 49 into the etching chamber 42 and evacuated through the gas outlet 50 to keep a pressure inside the chamber 42 at 0.1 Torr, and to which a high frequency (13.56 MHz) power of 300 W was applied by the power source 48. Accordingly, the RIE was carried out while varying the wafer temperature, and as a result, a vertical etching was attained at a wafer temperature of 50° C. to 150° C. The etching rate of the polycrystalline silicon was 220 nm/min and that of the $SiO_2$ was 2 nm/min, and thus the obtained etching selectivity of the polycrystalline silicon to the $SiO_2$ was as high as 110, and was repeatable.

The results are shown in Table 3.

EXAMPLE 16

The procedures of Example 15 were repeated except that the flow rate of HBr was increased. This increase of the flow rate of HBr, increased the etching rate of the polycrystalline silicon. At an HBr flow rate of 100 SCCM, the polycrystalline silicon etching rate was about 290 nm/min, with an etching selectivity of the polycrystalline silicon to the $SiO_2$ was 82.

The results are shown in Table 3.

EXAMPLE 17

The procedures of Example 15 were repeated except that oxygen ($O_2$) or water ($H_2O$), bearing an oxygen atom but no carbon atom, was added to the HBr etching gas. As a result, the etching rate of the polycrystalline silicon was not changed (220 nm/min), but the etching rate of the $SiO_2$ was lowered to 1 nm/min, and therefore, the etching selectivity of the polycrystalline silicon to the $SiO_2$ was higher than 200.

The results are shown in Table 3.

TABLE 3

| Ex. | Etching gas | Mask | Temp. for vertical etching (°C.) | Etch rate of Poly-Si (nm/min) | Etch rate of $SiO_2$ (nm/min) | Selectivity of Poli-Si/$SiO_2$ |
|---|---|---|---|---|---|---|
| 15 | HBr 25 SCCM | $SiO_2$ (or $Si_3N_4$) | 50–150 | 220 | 2 | 110 |
| 16 | HBr 100 SCCM | $SiO_2$ (or $Si_3N_4$) | 50–150 | 290 | 3.5 | 82 |
| 17 | HBr +O2 | $SiO_2$ (or $Si_3N_4$) | 50–150 | 220 | 1 | 220 |

EXAMPLE 19–22

In Examples 15 to 17, vertical etching was attained at a temperature of the wafer of 50° C. to 150° C. When the temperature of the wafer was lowered to less than 50° C., taper etching was attained with an inclination angle θ of the side wall of the etched pattern of less than 90°.

EXAMPLE 19

The procedures of Examples 15 to 18 were repeated, except that the etching chamber was made of aluminum coated with a teflon film.

The results are shown in Table 4.

TABLE 4

| Ex. | Etching gas | Mask | Temp. for vertical etching (°C.) | Etch rate of Poly-Si (nm/min) | Etch rate of $SiO_2$ (nm/min) | Selectivity of Poli-Si/$SiO_2$ |
|---|---|---|---|---|---|---|
| 19 | HBr | Resist | 50–90 | 220 | 15 | 15 |
| 20 | HBr | $SiO_2$ | 50–150 | 220 | 7 | 31 |
| 21 | HBr | $Si_3N_4$ | 50–150 | 220 | 7 | 31 |
| 22 | HBr/$O_2$ | $SiO_2$ | 50–150 | 220 | 5 | 44 |

As seen in Table 4, by using a chamber having a coating of a carbon-bearing material, the etching rate of the polycrystalline silicon was not changed, but the $SiO_2$ etching rate was increased, and thus the etching selectivity of the polycrystalline silicon to $SiO_2$ was decreased.

When other carbon-bearing materials such as polyacethal resin, carbon, silicon carbide etc. were used in the chamber or on the electrode, the $SiO_2$ etching rate was increased and the etching selectivity was decreased.

EXAMPLES 23 TO 28

The procedures of Examples 15 to 22 were repeated except that the etching gas was changed from HBr to other gases.

The results are shown in Table 5. The results were not varied, regardless of the material of the etching chamber.

Note, that, although etching with $SF_6$ at −130° C. provided an excellent etching rate and etching selectivity, etching at a low temperature of −130° C. requires a cooling mechanism using liquid nitrogen, etc., making the during apparatus complicated, less reliable, and expensive.

TABLE 5

| Ex. | Etching gas | Mask | Temp. for vertical etching (°C.) | Etch rate of Poly-Si (nm/min) | Etch rate of SiO₂ (nm/min) | Selectivity of Poli-Si/SiO₂ |
| --- | --- | --- | --- | --- | --- | --- |
| 23 | SF$_6$ | SiO$_2$ | −130 or less | 600 | 6 | 100 |
| 24 | CCl$_4$ | Resist | 50–100 | 400 | 80 | 5 |
| 25 | Cl$_2$ | Resist | 0 or less | 420 | 40 | 11 |
| 26 | Cl$_2$ | SiO$_2$ | −50 or less | 400 | 16 | 25 |
| 27 | Br$_2$/He | Resist | 50–70 | 190 | 14 | 14 |
| 28 | Br$_2$/He | SiO$_2$ | 50–70 | 190 | 9.5 | 20 |

EXAMPLE 29

The procedures of Example 15 were repeated, except that the HBr used had a purity of 99.99% and a carbon content of 30 ppm by volume based on $CO_2$.

The results are shown in Table 6.

EXAMPLE 30

The procedures of Example 29 were repeated, except that the HBr used had a purity of 99.8% and a carbon content of 350 ppm by volume based on $CO_2$.

The results are shown in Table 6.

The etching of the polycrystalline silicon per se was not affected, but the SiO$_2$ etching rate of was increased so that the etching selectivity of the polycrystalline silicon to the SiO$_2$ was reduced to 31.

EXAMPLE 32

Three kinds of samples were prepared for the following Examples.

Sample A: On a silicon wafer, a thermally oxidized film having a thickness of 10 nm was grown, on which a polycrystalline silicon layer having a thickness of 200 nm was deposited by CVD. Into the polycrystalline silicon layer, arsenic ions were implanted at 70 keV and $4 \times 10^{15}/cm^2$. On the As-doped polycrystalline silicon layer, a positive-type photoresist layer having a thickness of 1.2 μm was coated and patterned to a minimum width of 0.6 μm.

Sample B: This sample was similar to sample A, but As was not ion implanted and phosphorus was thermally diffused into the polycrystalline silicon to obtain a resistance of 60 Ω/cm$^2$.

Sample C: A thermally oxidized film having a thickness of

TABLE 6

| Ex. | Etching gas | Mask | Temp. for vertical etching (°C.) | Etch rate of Poly-Si (nm/min) | Etch rate of SiO₂ (nm/min) | Selectivity of Poli-Si/SiO₂ |
| --- | --- | --- | --- | --- | --- | --- |
| 29 | HBr 25 SCCM (high purity) | SiO$_2$ | 50–150 | 220 | 2 | 110 |
|  |  | Si$_3$N$_4$ | 50–150 | 220 | 2 | 110 |
| 30 | HBr 25 SCCM (low purity) | SiO$_2$ | 50–150 | 220 | 7 | 31 |
|  |  | SiO$_3$N$_4$ | 50–150 | 220 | 7 | 31 |

EXAMPLE 31

The procedures of Example 29 were repeated except that the etching gases used were 50 SCCM of the 99.99% HBr having a carbon content of 30 ppm (by volume as $CO_2$), mixed with 5 SCCM of a mixture of argon containing 3000 ppm by volume of $CH_4$ or $CO_2$ and a high purity argon containing no carbon at a various ratio. Namely, the HBr etching gas used had a varied carbon content.

Figure 7:
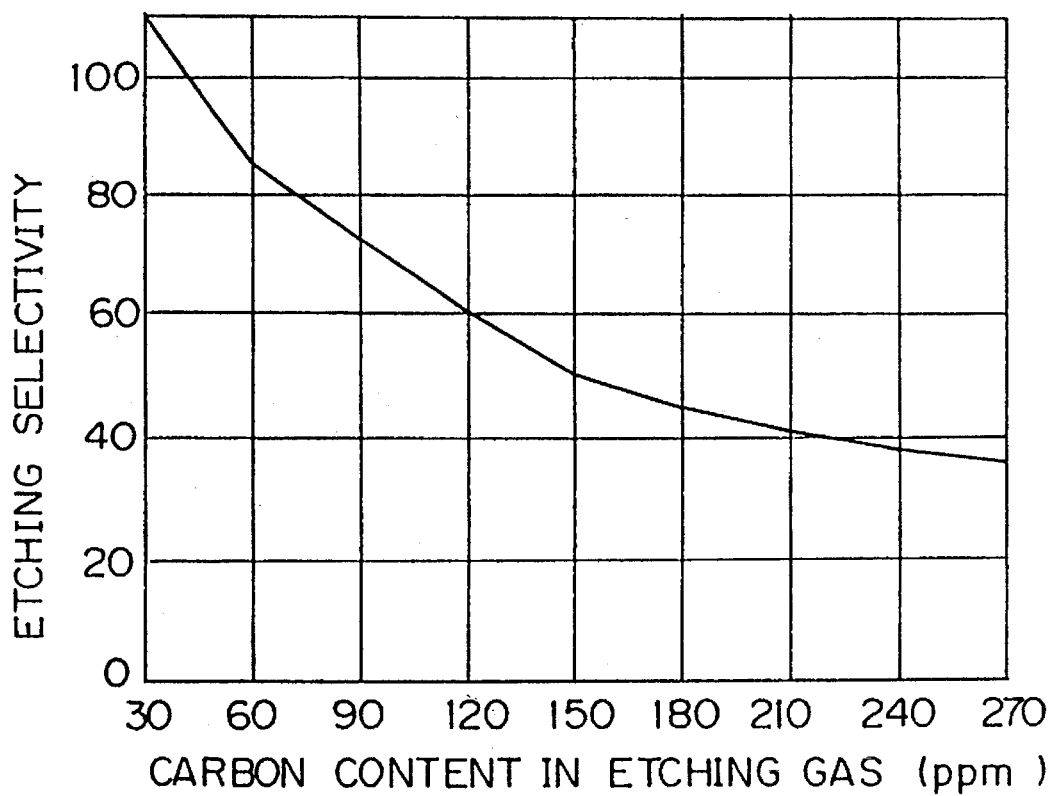
FIG. 7 shows a relationship of the etching selectivity of polycrystalline silicon to $SiO_2$ and the carbon content in etching gas.

The etching of the polycrystalline silicon was not changed by mixing the carbon content of the HBr, but the etching rate of the SiO$_2$ was increased when the carbon content was increased, and the etching selectivity of the polycrystalline silicon to the SiO$_2$ was decreased. Namely, selectivity was 100 at a 40 ppm carbon content and 60 at a 120 ppm carbon content. These results are shown in FIG. 7.

400 nm was grown on a silicon wafer. A resist pattern was formed on the oxidized film, in the same manner as for sample A.

The etching apparatus used was similar to that shown in FIG. 6. The etching conditions were: an HBr etching gas at 120 SCCM, and a wafer temperature of 20° C. to 150° C. The etching of the samples A and B was stopped before the polycrystalline silicon layer was completely removed and the etching rates of As-doped and P-doped polycrystalline silicons were determined.

The sample C was etched for 5 minutes and the etching rate of the oxidized film and the etching selectivity of the polycrystalline silicon to the oxidized film were determined.

The results are shown in Table 7.

TABLE 7

| Ex. | Etching gas | Mask | Wafer Temp. (°C.) | Etch rate of As-doped Poly-Si (nm/min) | Etch rate of P-doped Poly-Si (nm/min) | Etch rate of SiO₂ (nm/min) | Selectivity of P-doped Poly-Si/SiO₂ |
| --- | --- | --- | --- | --- | --- | --- | --- |
| 32 | HBr | Resist | 20 | 170 | 220 | 14 | 16 |
|  | HBr | Resist | 50 | 190 | 240 | 14 | 17 |
|  | HBr | Resist | 100 | 220 | 270 | 14 | 19 |
|  | HBr | Resist | 150 | 260 | 300 | 14 | 21 |

EXAMPLE 33

Figure 8:
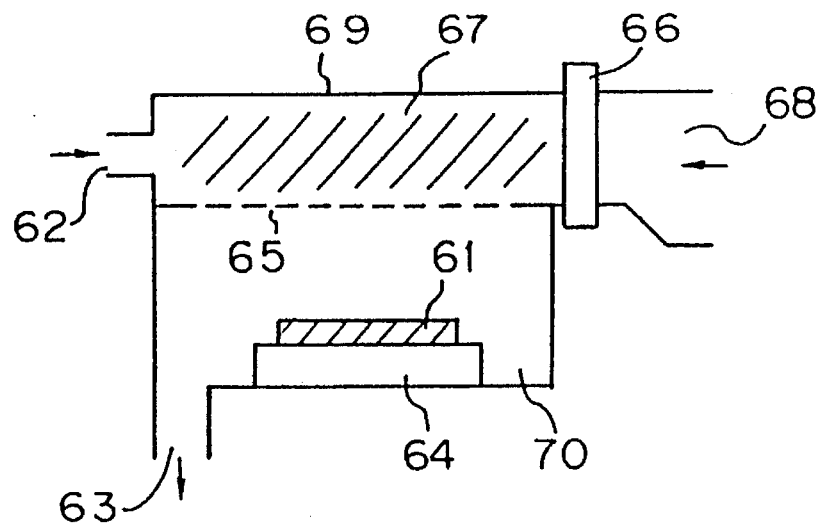
FIG. 8 is a schematical view of an apparatus for downflow treating.

The samples A and B were subject to etching under the same conditions as in Example 32, except that the wafer temperature was 100° C. and the etching was continued to a 50% overetching. The etched wafer was transferred under vacuum to a microwave down-flow treating apparatus, as shown in FIG. 8, connected to the etching apparatus through a vacuum chamber. In FIG. 8, 61 denotes a wafer, 62 a gas inlet, 63 an evacuation port, 64 a stage, 65 a perforated aluminum plate, 66 a microwave-introducing window, 67 a plasma, 68 a microwave inlet, 69 a plasma chamber, and 70 a sample chamber. In the microwave downflow treating apparatus, the above etched wafer and treated under the conditions of a gas mixture of oxygen at 1.5 SLM and tetrafluorocarbon at 200 SCCM, a pressure of 1.5 Torr, a microwave power of 1.5 kW, a wafer temperature of 60° C., and a time of 30 seconds. The wafer was then removed from the apparatus, and ashed by a barrel-type RF plasma ashing apparatus as shown in FIGS. 9, in which the 71 denotes a wafer, 72 a gas inlet, 73 a gas outlet, 74 a matching box, 75 a RF power, 76 a wafer holder, 77 and 78 electrodes, 79 a quartz chamber, and 80 a cover. The ashing conditions were: a flow rate of $O_2$ of 300 SCCM, a pressure of 1.0 Torr, a RF power of 300 W, a wafer temperature of 200° C.–300° C., and a time of 30 minutes, whereby the resist was removed.

Figure 10A:
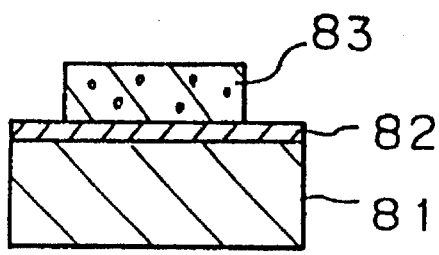
FIGS. 10A to 10D schematically show patterns obtainable by various ashing processes.

The resultant wafer was observed by an SEM (scanning electron microscope), and the etched polycrystalline silicon layers except for one etched at 20° C. were found to have a pattern 83 having a vertical side wall. The one etched at 20° C. were found to have a pattern of tapered side wall. As seen in FIG. 10A, no resistance of the polycrystalline silicon at the etched area and no residue of the resist on the polycrystalline silicon pattern were observed, and no damage to the underlying $SiO_2$ film 82 was found. In FIGS. 10A to 10D, 81 denotes a silicon wafer, 82, 82', and 82" an $SiO_2$ film, and 83 a pattern of the polycrystalline silicon layer.

EXAMPLE 34

The samples A and B were subject to etching under the same conditions as in Example 32 except that the wafer temperature was 100° C. and etching was conducted to a 50% overetching. This etched wafer was transferred under vacuum to the microwave down flow treatment apparatus as shown in FIG. 8 and treated under the conditions: a gas flow of 1.5 SLM oxygen and 200 SCCM tetrafluorocarbon, a pressure of 1.5 Torr, a microwave power of 1.5 kW, a wafer temperature of 60° C. and a time of 120 seconds.

The resultant wafers were observed by SEM, and the results were similar to those of Example 33.

EXAMPLE 36

The samples A and B were etched under conditions similar to those in Example 33, to a 50% overetching. After transferring the etched wafer to the apparatus shown in FIG. 8, the wafer was treated under the conditions of a gas flow of 1.5 SLM oxygen, 200 SCCM nitrogen and 100 SCCM water vapor, a pressure of 1.5 Torr, a microwave power of 1.5 kW, a wafer temperature of 150° C. and a time of 120 seconds. The treated wafer was then subjected to ashing by the apparatus shown in FIG. 9, under the conditions of a gas flow of 300 SCCM oxygen, a pressure of 1.0 Torr, a RF power of 300 W, a wafer temperature of 200° C.–300° C. and a time of 30 minutes, to remove the resist.

The resultant wafer was observed by SEM, and the results were similar to Example 33.

EXAMPLE 36

This example is comparative.

The samples A and B were etched under the same conditions as in Example 33, for a 50% overetching. The etched wafer was subjected to ashing by the apparatus shown in FIG. 9 under the conditions of a flow rate of 300 SCCM oxygen, a pressure of 1.0 Torr, a RF power of 300 W, a wafer temperature of 200° C.–300° C., and a time of 30 minutes, to remove the resist.

Figure 10B:
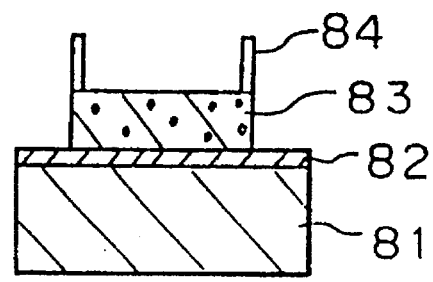

This wafer was observed by SEM. As seen in FIG. 10B, a portion 84 of only a side wall of the resist remains in the form of a fence.

Figure 10C:
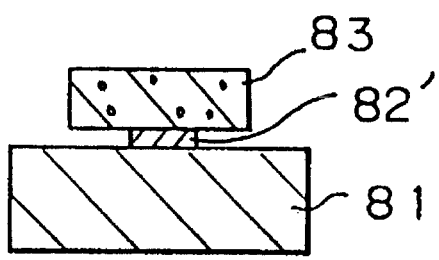

This wafer was cleaned with a dilute fluoric acid, and the resultant wafer was observed by SEM and it was found that the residue of the resist 84 in the form of a fence was removed, but the underlying $SiO_2$ film 82 was damaged by the dilute fluoric acid, as seen in FIG. 10C.

EXAMPLE 37

This Example is also comparative.

The samples A and B were etched with various etching gases at an RF power of 200 W and a pressure of 0.1 Torr. The apparatus used for etching was similar to that shown in FIG. 6, but helium gas at 10 Torr was filled in a closed space between the wafer and the electrode to reduce a temperature difference therebetween, and an appropriate cooling liquid such as water, methyl alcohol, nitrogen gas or liquid nitrogen was selectivity used. The procedures were the same as those in Example 32 except for the 50% overetching.

Figure 9A:
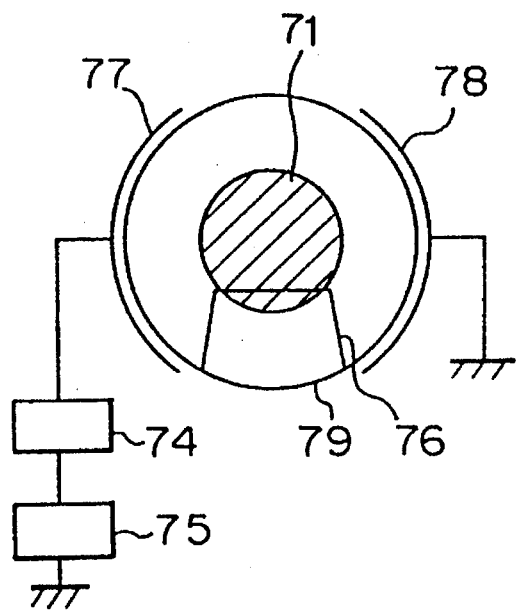
FIGS. 9A and 9B shows front and side views of an apparatus for ashing.
Figure 9B:
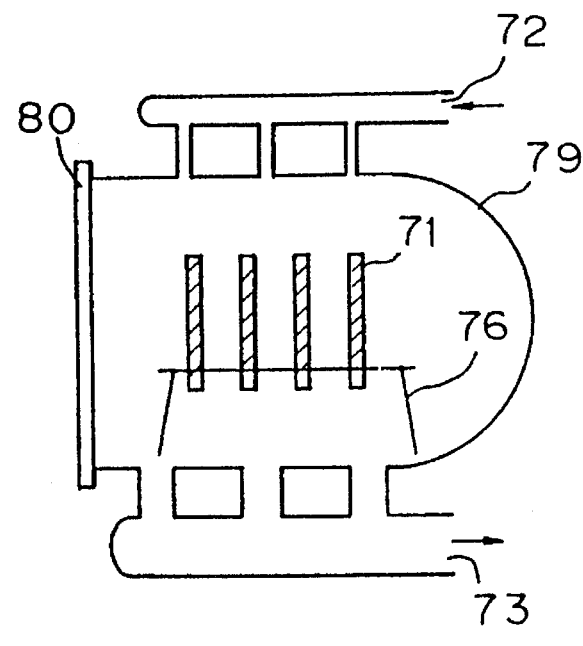
Figure 10D:
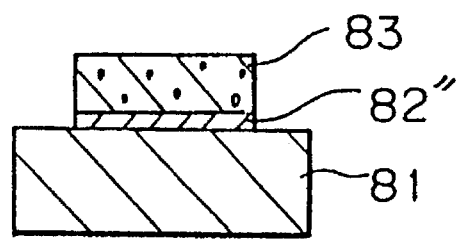

The resultant wafers were subject to ashing by an apparatus as shown in FIGS. 9A–9B, with oxygen to remove the resist. The ashed wafers were observed by SEM and had a structure as shown in FIG. 10A, i.e., no residue of the polycrystalline silicon in the areas to be etched and no residue of the resist, except for wafers etched by HBr. The wafer etched by tetrachlorocarbon $CCl_4$ had a structure as shown in FIG. 10D. Namely, the underlying $SiO_2$ film 82" was completely removed and the silicon wafer 81 was also etched at a portion where a resist does not exist thereover. This overetching was caused due to a low etching selectivity of the polycrystalline silicon to the $SiO_2$ when etching with $CCl_4$.

The results are shown in Table 8.

TABLE 8

| Ex. | Etching gas | Mask | Wafer Temp. (°C.) | Etch rate of As-doped Poly-Si (nm/min) | Etch rate of P-doped Poly-Si (nm/min) | Etch rate of $SiO_2$ (nm/min) | Selectivity of P-doped Poly-Si/$SiO_2$ |
|---|---|---|---|---|---|---|---|
| 37 | $SF_6$ | Resist | −130 | 500 | 500 | 7 | 71 |
|  | $Cl_2$ | Resist | −50 | 250 | 300 | 20 | 15 |
|  | $Br_2$/He | Resist | 100 | 120 | 150 | 9 | 17 |

TABLE 8-continued

| Ex. | Etching gas | Mask | Wafer Temp. (°C.) | Etch rate of As-doped Poly-Si (nm/min) | Etch rate of P-doped Poly-Si (nm/min) | Etch rate of $SiO_2$ (nm/min) | Selectivity of P-doped Poly-Si/$SiO_2$ |
|---|---|---|---|---|---|---|---|
| | $CCl_4$ | Resist | 100 | 340 | 400 | 50 | 8 |

EXAMPLE 38

The samples A and B were etched under the same conditions as in Example 33 for a 50% overetching. The etched wafer was subject to ashing in the same manner as that in Example 36 to remove the resist. The wafer was then treated in an apparatus as shown in FIG. 8 under the conditions of a gas flow of 1.5 SLM $O_2$ and 200 SLM $CF_4$, a pressure of 1.5 Torr, a microwave power of 1.5 kW, a wafer temperature of 60° C. and a time of 120 seconds.

The resultant wafers were observed by SEM and the results were similar to:those in Example 32. Namely, the etched pattern of the polycrystalline silicon layer had a vertical side wall except for one etched at 20° (The one etched at 20° C. had a tapered side wall.); no residue of the polycrystalline silicon in areas to be etched and no residue of the resist were observed; and the underlying $SiO_2$ film was not damaged; as shown in FIG. 10A.

Note that a gas such as $CF_4$ that contains halogen may be added to oxygen to enhance the generation of excited oxygen atoms, but too high a halogen content results in a simultaneous etching of the polycrystalline silicon and oxide.

Plasma etching may be carried out not only by reactive ion etching, but also by parallel plate type plasma etching, or by electron cycloton resonance plasma etching, or by microwave plasma etching, or by magnetron plasma etching.

The etching gas may be a combination of hydrogen bromide or bromine with oxygen, nitrogen, hydrogen, a rare gas such as argon and helium, a Freon gas such as $CF_4$, $CBrF_3$, $CHF_3$ and $C_2ClF_5$, a halogen-bearing gas such as $SF_6$, $NF_3$, $Cl_2$, $BCl_3$, $SiCl_4$ and $CCl_4$.

Not only a polycrystalline silicon, but also a single crystalline silicon, silicides or high melting point metals may be precisely etched with a high etching selectivity.

We claim:

1. A process for selectively etching a mass, comprising:

providing an etching mask over the mass to expose an area of the mass to be etched; and providing a plasma of an etching gas in contact with said mass in an etching chamber, whereby said exposed area of said mass is selectively etched, wherein said etching gas has a purity of 99.99% or more and contains as the main reactive component reacting with said mass hydrogen bromide, and wherein said etching chamber has no carbon-bearing material in contact with said plasma of the etching gas.

2. A process according to claim 1, wherein said etching gas contains less than 120 ppm of carbon content based on the total weight of said etching gas.

3. A process according to claim 2, wherein said etching gas contains less than 40 ppm of carbon content based on the total weight of said etching gas.

4. A process according to claim 2, wherein said etching mask is composed of a non-carbon-bearing material.

5. A process according to claim 1, wherein said mass is made of a polycrystalline silicon and said etching mask is made of silicon oxide or nitride.

* * * * *